United States Patent [19]

Itoh et al.

[11] 4,144,503

[45] Mar. 13, 1979

[54] SEMICONDUCTOR LASER WITH LIGHT GUIDE

[75] Inventors: Kunio Itoh; Morio Inoue, both of Takatsuki, Japan

[73] Assignee: Matsushita Electric Industrial Co., Ltd., Kadoma, Japan

[21] Appl. No.: 746,750

[22] Filed: Dec. 2, 1976

[30] Foreign Application Priority Data

Dec. 5, 1975 [JP] Japan .................. 50/145720

[51] Int. Cl.² ............................................. H01S 3/19
[52] U.S. Cl. ........................... 331/94.5 H; 350/96.12
[58] Field of Search ............ 331/94.5 H; 350/96 WG, 350/96.12, 96.11, 96.10

[56] References Cited

U.S. PATENT DOCUMENTS

| 3,785,717 | 1/1974 | Croset et al. ................. 350/96 WG |
| 3,968,564 | 7/1976 | Springthorpe ................ 350/96 WG |

OTHER PUBLICATIONS

J. Free, "The Coming Age of Fiber Optics: How Wires of Glass will Revolutionize Communications", *Popular Science*, vol. 207, No. 2, Aug. 1975, pp. 82-85 and 111.
D. Schicketanz et al., "GaAs-Double-Heterostructure Lasers as Optical Amplifiers", IEEE J. of Quantum Electronics, vol. QE-11, No. 2 Feb. 1975, pp. 65-69.
Hurwitz et al., "Integrated GaAs-AlGaAs Double-Heterostructure Lasers", Applied Physics Letters, vol. 27, No. 4, Aug. 15, 1975, pp. 241-243.
Garmire, "Moving Toward Integrated Optics", *Laser Focus* Oct. 1975, pp. 55-59.

*Primary Examiner*—Stanley D. Miller, Jr.
*Assistant Examiner*—James W. Davie
*Attorney, Agent, or Firm*—Cushman, Darby & Cushman

[57] ABSTRACT

In a semiconductor laser with light guide, wherein an active region to form the Fabry-Perot cavity is formed in a mesa part on a semiconductor substrate and mixed crystal semiconductor parts formed to fill the mesa-etched parts constitute light guides. The improvement is that a crystal semiconductor of the active region has the composition of $Ga_{1-x}Al_xAs$ ($0 \leq x < 1$) and a mixed crystal of the light guide has the composition of $GaAs_{1-y}P_y$ ($0 < y < 1$) or $Ga_{1-z}Al_zAs$ ($0 < x < z < 1$) of sufficiently high (for instance, $10^4 \Omega cm$) specific resistivity with respect to that of the active region, the value of y or z being selected to be smallest at a depth of the light guide where the lasing light is incident, and the energy gap of the mixed crystal part being selected to be larger than that of said active region, so that light loss in the light guide is decreased.

7 Claims, 7 Drawing Figures

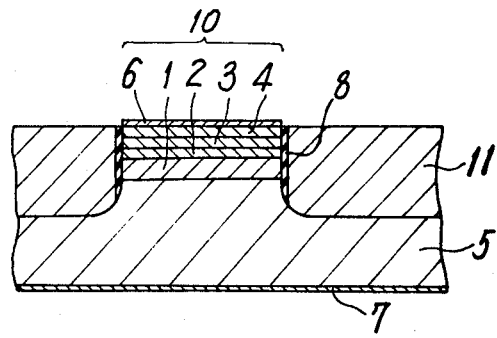
FIG. 1. (Prior Art)
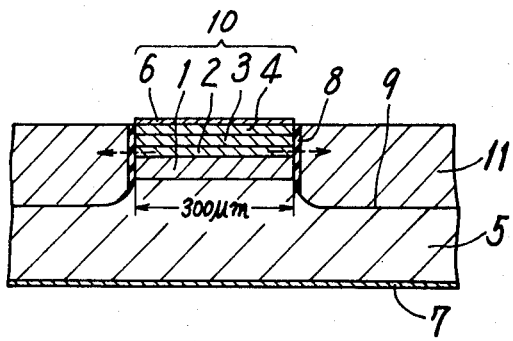
FIG. 2(a).
FIG. 2(b).
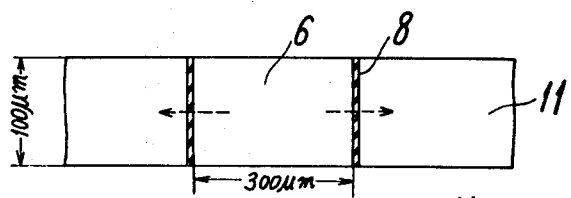
FIG. 2(c).
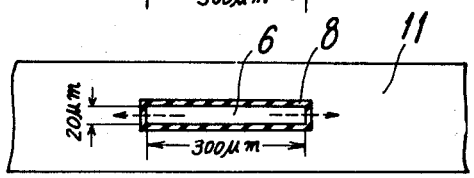
FIG. 3(a). FIG. 3(b). FIG. 3(c).
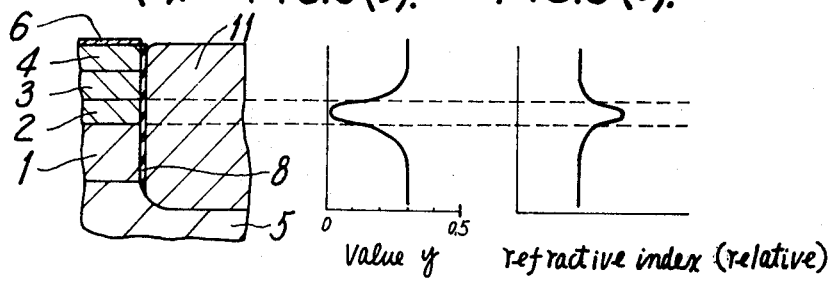
Value y    refractive index (relative)

SEMICONDUCTOR LASER WITH LIGHT GUIDE

BACKGROUND OF THE INVENTION

This invention relates to semiconductor laser with light guide wherein a light guide part is coupled to a light output part of the semiconductor laser.

Semiconductor lasers are useful as light sources for integrated optical circuits. Matching between the light guides and end parts of laser active regions, namely the Fabry-Perot cavities, are important in the proper operation of the semiconductor laser. In order to attain satisfactory matching, it is desirable to make the semiconductor laser and the light guides in a united structure.

Such united structure of the semiconductor laser and light guides is described in an article entitled "Integrated GaAs-AlGaAs double heterostructure laser" by C. E. Hurwitz etal in "Applied Physics Letters", vol. 27, No. 4,15 August 1975, pages 241 - 243. In this article, as shown in FIG. 1 of a sectional view, a semiconductor laser comprises a laser part 10 and a light guide part 11 on a single wafer. The laser part is made by sequential epitaxial growths on a substrate 5 of n-type GaAs, of a first layer 1 of n-type $Ga_{0.7}Al_{0.3}As$, a second layer 2, i.e., an active region 2 of p-type GaAs, a third layer 3 of p-type $Ga_{0.7}Al_{0.3}As$ and a fourth layer 4 of p-type GaAs, in sequence and then attaching electrodes 6 and 7. The light guide parts 11 is made by forming n-type GaAs of low impurity concentration in mesa-etched hollow parts of the laser part 10. The laser part and the light guide parts 11 are isolated from each other by an insulation films 8, 8 such as $SiO_2$ inbetween.

In such semiconductor laser of the prior art, the light guide parts are several times thicker than the active region 2, and accordingly, the lasing light from the active region 2 diverges into such wide angle of several tens of degrees, thereby making convergence of the lasing light difficult.

SUMMARY OF THE INVENTION

One object of the present invention is to provide a semiconductor laser with light guide, wherein in the light guide part the light divergence is sufficiently small as well as the light loss.

Another object of the present invention is to propose a laser constitution capable of taking out lasing output with less transmission loss as a consequence of novel structure of coupling between the laser part and the light guide parts.

Another principal feature of the present invention is that the light guide coupled to the semiconductor laser is formed with $GaAs_{1-y}P_y$ or $Ga_{1-y}Al_yAs$ ($0<y<1$), wherein the value y is selected to be smallest at the part where the lasing light is incident thereto from the active region and to be gradually larger in upper and lower portions spaced from the abovementioned part of smallest y. By selecting energy gap of the mixed crystal $GaAs_{1-y}P_y$ or $Ga_{1-y}Al_yAs$ of the light guide to be larger than that of the active region of the laser part, light loss of the light in the light guide can be decreased.

BRIEF EXPLANATION OF THE DRAWING

FIG. 1 is a sectional sideview of a semiconductor laser with light guide of prior art, FIG. 2(a) is a sectional sideview of a semiconductor laser with light guide of one example of the present invention, FIG. 2(b) is a plan view of the laser of FIG. 2(a), FIG. 2(c) is a plan view of a modified example, FIGS. 3(a), (b) and (c) are an enlarged sideview of a part of FIG. 2(a), a graph showing distribution of y value of the composition $GaAs_{1-y}P_y$ of the light guide part and a graph showing distribution of relative refractive index of the light guide part, respectively.

DETAILED DESCRIPTION OF THE INVENTION

FIG. 2(a) and FIG. 2(b) show sectional sideviews and plan views of one example of the present invention. The laser of the example of FIGS. 2(a) and 2(b) is made as follows:

On a semiconductor substrate 5 of n-type GaAs, a first layer 1 of 2μm thick n-type $Ga_{0.7}Al_{0.3}As$, a second layer 2 of 0.2μm thick p-type GaAs, a third layer 3 of 1μm thick p-type $Ga_{0.7}Al_{0.3}As$ and a fourth layer 4 of 1μm thick $p^+$-type GaAs are formed by sequential epitaxial growths. Then a mesa-etching from the fourth layer 4 to an upper part of the substrate 5 is carried out to form mesa-etched hollow parts 9 so as to retain mesa-part 10. Thus, the laser part comprising an active region, i.e., a resonant cavity 2 of the p-type GaAs is formed. The bottom of the mesa-etched hollows may be in the first layer 1 instead of the abovementioned structure where the bottom of the mesa-etched hollows are in the substrate. Then, insulation films 8, 8 of $SiO_2$ are formed on both end walls of the laser part 10 by known thermal decomposition of silane in oxidizing atmosphere or by known chemical vapor deposition of $SiO_2$. Instead of $SiO_2$ film, $Si_3N_4$ may also be usable as the insulation films. The refractive indexes of these insulation films 8, 8 are lower than that of the active region 2, and hence form the end mirrors for the Fabry-Perot cavity.

Then, a high resistivity layer 11 of $GaAs_{1-y}P_y$ is filled out in the mesa-etched hollow parts 9 in a manner that the top faces of the filled-out high resistivity layers 11, 11 and the fourth layer 4 are flush with each other. The resistivity of the high resistivity layer should be relatively higher, for instance, about $10^4 \Omega cm$, than that of the layers in the laser part. The high resistivity layers 11, 11 form light guides which are coupled to both end faces of the laser part 10 so as to receive lasing light therefrom. In the high resistivity layers 11, 11 filled in the mesa-etched hollow part, i.e., in the light guides, the value y representing a phosphorous amount is controlled in a manner, as shown in FIG. 3(a) and FIG. 3(b), to be smallest at the depth equal to the center part of the active region 2 of the laser part, becoming larger as parting from the abovementioned depth and becoming uniform in parts which are apart upward and downward from the abovementioned depth by more than several μm. As a consequence of the abovementioned controlling of y value, hence the phosphorous component, the refractive index of the light guides 11, 11 is made to be of square index distribution (parabolic distribution). The lights lased in the laser part and put out of the active region part 2, through the transparent $SiO_2$ films 8, 8 and into the light guide 11, 11, are converged by means of the abovementioned refractive index distribution. Thus, the lights are converged within thin ranges of several μm thickness which are optically coupled to both ends of the active layer with the insulation film inbetween. Since the lights transmitted through the light guides 11, 11 are well converged, loss of the lights are very little, and the lights which is put out of the light guides 11, 11 are well converged, have almost undistorted mode and hence obtainable almost without loss. By selecting the value y of the light guide part 11, 11 of $GaAs_{1-y}P_y$ to be $0<y$, namely by containing at least a small amount of phosphorous therein, at the same depth with the center part in thickness of the active region 2 the energy gap of the light guide part 11, 11 can be made larger than that of the active region 2, and therefore, light absorption in the light guide is substantially eliminated.

According to empirical facts, in the case of combination of the light guides 11, 11 of $GaAs_{1-y}P_y$ and the active region 2 of p-type GaAs coupled thereto, the value y can be changed in the region of $0<y<1$. The optimum range of y is $0<y\geq 0.3$, since the crystal strain is very small for this range. In the above-mentioned combination, it is to be noted to design in a manner that the energy gap of the light guide 11 should be selected to be larger than that of the active region 2.

In a modified case a part of Ga in GaAs of the active region 2 is replaced by Al to form an active region of $Ga_{1-x}Al_xAs$ (wherein $0<x<1$), the value y of the light guides 11, 11 should be selected within the range of $0<y<1$, so that the distribution in the thickness direction of the refractive index becomes analogous to FIG. 3(c).

In a further modified case, empirical results show that the light guide can be made with $Ga_{1-z}Al_zAs$ wherein $0<z<x<1$, instead of the abovementioned $GaAs_{1-y}P_y$. In such combination of the active region and the light guide, refractive index, as well as energy gap of the light guide can be made larger than those of the active region, thereby attaining good convergence of light as well as small absorption of light in the light guide.

As a conclusion, according to the present invention, for the combination of the active region of $Ga_{1-x}Al_xAs$ (wherein $0\geq x<1$) and the light guides selected from the group of $GaAs_{1-y}P_y$ (wherein $0<y<1$) and $Ga_{1-z}Al_zAs$ (wherein $0<x<z<1$) the distribution of the refractive index is selected to be largest at the depth equal to the center of thickness of the active region.

FIG. 2(c) shows plan view of another example wherein the mesa-etching is made on all side faces of the epitaxially grown layers and sectional sideview is identical to FIG. 2(a). In this example, the mesa part, hence, the active region 2 is formed in a stripe shape of 20μm width and 300μm length in the plan view, with insulation film 8 surrounding all four side faces of the mesa part, and a light guide part 11 is formed to surround all side faces of the mesa part.

Since the resistivity of $GaAs_{1-y}P_y$ or $Ga_{1-z}Al_zAs$ of the light guides 11, 11 is very high, no appreciable leakage current is produced, even without the insulation film 8 on two longer walls of the mesa part. Accordingly, the insulative film 8 may be omitted. Where the mesa part is stripe shaped, the light guide part may be designed in a striped configuration having the same width as that of the mesa part.

The sizes of the mesa parts of the semiconductor lasers of FIG. 2(b) and FIG. 2(c) should be varied in accordance with the required outputs and the lasing modes.

A process for making the above mentioned semiconductor device is elucidated in the following:

First, by means of known sequential epitaxial growth method, the abovementioned first layer 1 of n-type $Ga_{0.7}Al_{0.3}As$ of 2 μm thickness, the second layer 2 of p-type GaAs of 0.2 μm thickness, the third layer 3 of p-type $Ga_{0.7}Al_{0.3}As$ the 1 μm thickness, and the fourth layer 4 of p⁺-type GaAs of 1 μm thickness are sequentially formed on the substrate 5 of n-type GaAs. Either of vapor phase epitaxial growth method or liquid phase epitaxial growth method can be used.

Then, the wafer is etched to form the mesa hollow parts while retaining the mesa part. The etching is made with known etchant of mixed solution of sulfuric acid, hydrogen peroxicide and water since the wafer is made of GaAs and $Ga_{0.7}Al_{0.3}As$. The etching is made from the top layer, namely fourth layer to the bottom layer, namely the substrate 5, and the etching should be made at least up to a certain level of the first layer 1. Namely, bottom of the etched hollow parts may be either in the first layer 1 or in the substrate 5. In the mesa-etching, the depth of the mesa-etched hollow should be well controlled in order to accurately control the depth of the smallest y value part in the next step of forming the light guides 11, 11 of high resistivity $GaAs_{1-y}P_y$, so that the depth of the smallest y value part can be controlled same with the depth of the center part of the active region, i.e., the second layer 2. By employing known chemical vapor depositions or known molecular beam epitaxial growth methods in forming the high resistivity $GaAs_{1-y}P_y$ layer, the growth speed can be controlled very accurately. For instance, by employing thermal decomposition and reaction at 630° C. of mixed gas consisting of gases of $Ga(CH_3)_3$, $AsH_3$ and $PH_3$, a layer of sufficiently high resistivity of $10^5 \Omega cm$ is formed at the growth speed of 0.6 μm per minute. During the growth process, component ratio of $AsH_3$ and $PH_3$ is controlled in a manner that the value of y is made smallest at the depth equal to the center part of the active region 2, gradually larger as apart from the above-mentioned depth and uniform as apart by more than several μm. This controlling is made by utilizing the accurately measured depth of the mesa-etched hollow parts.

Thus in the high resistivity light guide parts 11, 11 the parts of smallest y value lie at the depth as that of the center part of the active region 2, so that the parts of largest refractive index lie on the same plane with the center plane of the active region 2.

Finally, a pair of electrodes 6 and 7 of Au films are attached by known vacuum deposition method to the top and bottom face of the laser part. Thus, the semiconductor laser with the light guide 11, 11 is completed.

When $Ga_{1-z}Al_zAs$ is employed as the high resistivity light guide parts 11, 11 its making process can be almost similar to the abovementioned method.

As has been elucidated referring to the examples, the semiconductor laser comprises the light guide parts enabling small light loss and good light convergence, and hence, efficient light transmission. Accordingly, the present invention is suitable, for instance, as light sources for integrated optical circuits. The making process of the present invention is easy and suitable for mass production.

What we claim is:

1. A semiconductor laser light guide comprising:
   a laser part which includes an active region also operating as a Fabry-Perot cavity on a monolithic semiconductor wafer; and
   at least a light guide part which is of a mixed crystal selected from the group consisting of $GaAs_{1-y}P_y$ and $Ga_{1-z}Al_zAs$ where $0<y<1$ and $0<z<1$, formed by epitaxial growth on said semiconductor wafer, said light guide part having a much higher resistivity than that of the laser part, and being optically coupled to said laser part the values of y and z chosen to provide in said light guide part a predetermined graded-index distribution in which the refractive index is largest within a plane in said light guide which includes the center of the path of lased light coming out of said active region of the laser.

2. A semiconductor laser of claim 1, wherein said laser part comprises a heterojunction of GaAs—$Ga_{1-x}Al_xAs$ for $0 \leq x < 1$ between said active region of $Ga_{1-x}Al_xAs$ and the neighboring GaAs region and said light guide part is made of $GaAs_{1-y}P_y$, the value y being smallest at the position of said plane in said light guide including the center of the path of lased light.

3. A semiconductor laser of claim 1 wherein said laser part comprising a heterojunction of GaAs—$Ga_{1-x}Al_xAs$ for $0 \leq x < 1$ between said active region of $Ga_{1-x}Al_xAs$ and the neighboring GaAs region and said light guide part is made of $Ga_{1-z}Al_zAs$ for $0 < x < z < 1$, the value z being smallest at the position of said plane in said light guide including the center of the path of lased light.

4. A semiconductor laser light guide comprising:

a laser part which includes an active region also operating as a Fabry-Perot cavity on a monolithic semiconductor wafer; and at least a light guide part comprising a mixed crystal selected from the group consisting of $GaAs_{1-y}P_y$ and $Ga_{1-z}Al_zAs$ where $0 < y < 1$ and $0 < z < 1$, formed by epitaxial growth on said semiconductor wafer, the values of y and z chosen to provide in said light guide part a parabolic refractive index distribution, said light guide part being optically coupled to said laser part, with said distribution of refractive index largest at the position of a plane in said light guide which includes the center of the path of lased light coming out of said active region of the laser.

5. The semiconductor laser of claim 4 wherein said light guide part has a much higher resistivity than that of the laser part.

6. The semiconductor laser of claim 5 wherein the resistivity of said light guide part is on the order of $10^4 \Omega cm$.

7. The semiconductor laser of claim 1 wherein the resistivity of said light guide part is on the order of $10^4 \Omega cm$.

* * * * *